United States Patent [19]
Baba et al.

[11] Patent Number: 5,138,179
[45] Date of Patent: Aug. 11, 1992

[54] METHOD OF AND DEVICE FOR DIAMETER MEASUREMENT USED IN AUTOMATICALLY CONTROLLED CRYSTAL GROWTH

[75] Inventors: Masahiko Baba, Annaka; Hiroshi Ohtsuna, Sabae, both of Japan

[73] Assignee: Shin-Etsu Handotai Company, Limited, Tokyo, Japan

[21] Appl. No.: 685,587

[22] Filed: Mar. 29, 1991

[30] Foreign Application Priority Data

Mar. 29, 1990 [JP] Japan .................................... 2-81673

[51] Int. Cl.⁵ .......................... G01N 21/86; G01V 9/04
[52] U.S. Cl. .................................... 250/560; 250/577; 156/601
[58] Field of Search ................. 250/560, 577; 156/601

[56] References Cited

U.S. PATENT DOCUMENTS

| | | | |
|---|---|---|---|
| 3,998,598 | 12/1976 | Bonora | 156/601 |
| 4,617,173 | 10/1986 | Latka | 156/601 |
| 4,710,258 | 12/1987 | Latka | 156/601 |
| 4,794,263 | 12/1988 | Katsuoka et al. | 250/560 |
| 4,918,520 | 4/1990 | Katsuoka et al. | 156/601 |
| 4,926,357 | 5/1990 | Katsuoka et al. | 156/601 |
| 4,973,377 | 11/1990 | Katsuoka et al. | 156/601 |

FOREIGN PATENT DOCUMENTS 2054137 11/1981 United Kingdom .

OTHER PUBLICATIONS

IBM Technical Disclosure Bulletin, vol. 24, No. 11 B, Apr. 1982, K. M. Kim et al., "Technique for Monitoring Diameter Variation in Czochralski Crystal Growth," pp. 6038–6039.

*Primary Examiner*—Bruce C. Anderson
*Attorney, Agent, or Firm*—Browdy and Neimark

[57] ABSTRACT

Disclosed are a method of and a device for crystal diameter measurement in an apparatus for automatically controlling single crystal growth by the CZ technique. In the diameter measurement method, a growing region of a single crystal 32 is photographed by a camera 38, and an outer diamter Do of a luminous ring image 70 having a luminance above a reference value E is detected from a video signal supplied from the camera 38, the diameter Do thus detected being used for crystal diameter control. The crystal diameter measuring device comprises: a camera 38 for photographing a growing section of a single crystal 32 and supplying a video signal; devices for detecting a maximum video signal value with respect to one scanning line or more; a device for obtaining a reference value E corresponding to the above-mentioned maximum value; devices for binary-coding the video signal in comparison with the reference value E; and a device for detecting the outer diameter Do of a luminous image from a binary image obtained by the binary-coding.

13 Claims, 7 Drawing Sheets

RELATIONSHIP BETWEEN Do₁ AND DR IN SECTION WHERE CRYSTAL DIAMETER INCREASES

RELATIONSHIP BETWEEN Dod AND DR IN SECTION WHERE CRYSTAL DIAMETER DECREASES

METHOD OF AND DEVICE FOR DIAMETER MEASUREMENT USED IN AUTOMATICALLY CONTROLLED CRYSTAL GROWTH

BACKGROUND OF THE INVENTION

1. Field of the Invention

This invention relates to a method of and a device for crystal diameter measurement to be used in an apparatus for automatically controlling single crystal growth by the CZ technique.

2. Description of the Related Art

A conventional example of such a crystal diameter measuring device will be described with reference to FIGS. 3 to 5, which will also be referred to in an illustration of an embodiment of the present invention. In a conventional device, a luminous ring 23, which is formed in the border between the surface 22S of a melt 22 and a silicon single-crystal 32 which is pulled up, is photographed by a CCD camera, and the resulting video signal is binary-coded to obtain a binary image 68. The inner diameter $D_I$ of the luminous ring image 70 contained in this binary image 68 is detected and multiplied by a constant, thereby obtaining the actual lower end diameter $D_R$ of the silicon single-crystal 32. When the length of the line 72 through the center of the luminous ring image 70 is of actual size, the difference between the inner diameter $D_I$ and the real diameter $D_R$ is almost negligible. Further, this difference has substantially nothing to do with the real diameter $D_R$, the surface inclination, etc., of the silicon single-crystal 32. Accordingly, with this conventional diameter measuring device for automatically controlled crystal growth, the real diameter $D_R$ can be measured with high accuracy.

In a single crystal growth apparatus using the CZ technique, an automatic control method has been established for use in those stages from beginning with the growth of the corn region of the crystal and thereafter. However, the stages for forming the necked region of the crystal, beginning with the immersion of the seed crystal in the melt to the stage for the growth of the corn region, are manually conducted by a skilled operator to terminate any dislocation in the necked region of the growing crystal. To effect this, a high level of manual skillfulness is required. For example, the diameter of the necked region of the growing crystal must be limited to a range of 2 to 5 mm, and the crystal has to be pulled at a relatively high rate of not less than 2 mm/min. Furthermore, the absolute value of the deviation in diameter control has to be around 0.5 mm or less, and the necked region has to be allowed to grow in a length ten times larger than the diameter thereof. The operation of forming the necked region and the subsequent operation of augmenting the crystal diameter, while imparting a desired shape to the crystal without leaving any dislocation therein, are so difficult, that even a skilled operator can perform it with a failure rate of as much as 10 percent of all the trial. If the diameter is excessively narrowed, a disconnection occurs in the region between the surface of the melt and the lower end of the growing crystal, thereby making it impossible to continue the growth of the necked region. If such a disconnection is avoided somehow, the cylindrical section grown afterwards cannot be supported because of the weakness of the necked region with excessive narrowness in diameter. An overly large crystal diameter is not desirable in the necked region, either, since that would not sufficiently allow for the termination of any dislocation, thereby making it impossible to move on to the next stage for the growth of the corn region.

SUMMARY OF THE INVENTION

In view of the above problems, it is the object of this invention to provide a method of and a device for diameter measurement in automatic crystal growth control which are suitable for use in automatic control of the growth of the necked region of a single crystal.

(1) In accordance with the diameter measurement method for automatic crystal growth control of this invention, the above object can be achieved by photographing a growing region of a single crystal by a camera, detecting an outer diameter of a luminous ring image having a luminance above a reference value from a video signal supplied from the camera, and utilizing this diameter for the diameter control.

Assuming that the real diameter is $D_R$, the outer diameter of the luminous ring image is $D_O$, the inner diameter of the luminous ring image is $D_I$, the respective increments of these diameters when they are increased are $\Delta D_{Ri}$, $\Delta D_{Oi}$, and $\Delta D_{Ii}$, and the respective decrements of these diameters when they decrease are $\Delta D_{Rd}$, $\Delta D_{Od}$, and $\Delta D_{Id}$, $D_I$ is substantially equal to $D_R$, and $$\Delta D_{Id}/\Delta D_{Rd} = \Delta D_{Ii}/\Delta D_{Ri}.$$

However, with respect to $D_O$ and $D_R$, the following holds true:

$$\Delta D_{Od}/\Delta D_{Rd} > \Delta D_{Oi}/\Delta D_{Ri}.$$

Accordingly, if, in crystal growth control, the outer diameter $D_O$ of the luminous ring is used instead of the inner diameter $D_I$ thereof, the adjustment of the outer diameter for causing the outer diameter $D_O$ to approach the desired value when the outer diameter $D_O$ is smaller than that is larger than in the reverse case with a larger outer diameter $D_O$.

In the growth of the necked region whose diameter is limited to 2 to 5 mm, making the diameter of the pulled single crystal too small results in a disconnection between the lower single crystal end and the surface of the melt, making it impossible to continue the crystal growth. With this invention, such a disconnection can be avoided for the reason stated above, making it easier to succeed in the difficult operation of controlling the growth of the necked region.

Further, when used in the growth of the cylindrical region of the crystal, this invention makes it possible to substantially equalize the minimum radius of the cylindrical region with the desired value, so that the portion to be removed from therefrom when making it cylindrical by grinding can be reduced.

(2) In accordance with this invention, the above-described method is practiced by using a crystal diameter measuring device comprising: a camera for photographing a growing section of a single crystal and outputting a video signal; a means for detecting a maximum video signal value with respect to one scanning line or more; a means for obtaining a reference value corresponding to the above-mentioned maximum value; a means for binary-coding the video signal in comparison with the reference value; and a means for detecting the outer diameter of a luminous image from a binary image obtained by the binary-coding, the diameter thus obtained being used for crystal diameter control.

(3) The effect of the above-described method can also be attained by obtaining through calculation a value $D_{OL}$ analogous to $D_O$ from the inner diameter $D_I$, i.e., by photographing the growing single crystal region by a camera, detecting the inner diameter $D_I$ of a luminous ring image whose luminance is above the reference value from the video signal supplied from the camera, storing this diameter in memory, and adding to or subtracting from the detected diameter $D_I$ a value $\Delta D$ which corresponds to the difference between the diameter $D_I$ and a diameter $D_{IB}$ detected a fixed time earlier and which is in accordance with whether the difference is positive or negative, the sum thereby obtained being used as the diameter for crystal diameter control.

The above method (3) can make the diameter control more satisfactory one by the learning of the relationship between the $D_I$ and $\Delta D$.

BRIEF DESCRIPTION OF THE DRAWINGS

First Embodiment

A first embodiment of this invention are illustrated in FIGS. 1 to 8, of which.

DETAILED DESCRIPTION OF PREFERRED EMBODIMENTS

First Embodiment

An embodiment of this invention will now be described with reference to the accompanying drawings.

Figure 1:
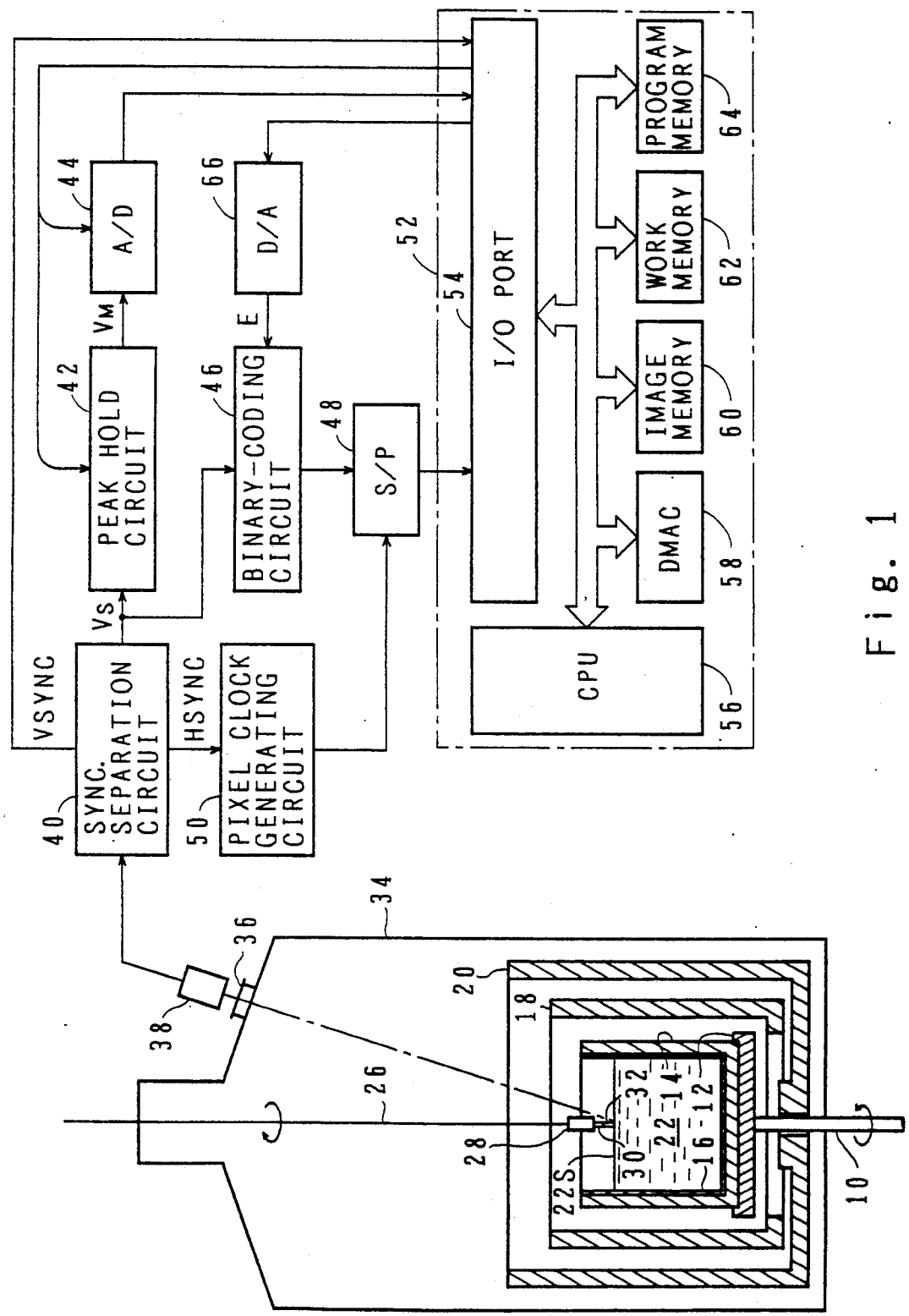
FIG. 1 is a hardware block diagram showing a diameter measuring device for automatic crystal growth control.

FIG. 1 shows the essential parts of a diameter measuring device for automatic crystal growth control to which the method of this invention is applied.

Placed on a platform 12 attached to the upper end of a shaft 10 is a graphite crucible 14, in which a quartz crucible 16 is fitted. The graphite crucible 14 is surrounded by a heater 18, which is surrounded by a graphite heat insulator 20. Lumps of polycrystalline silicon are put in the quart crucible and electricity is supplied to the heater 18, thereby obtaining a melt 22 from the polycrystalline silicon.

Attached to the lower end of a wire 26, adapted to be raised and lowered by a motor (not shown) arranged above the melt 22, is a seed crystal 30 held at its upper end by a seed holder 28. When the lower end of this seed crystal 30 is brought into contact with the surface 22S of the melt 22 and is then pulled up, a silicon single-crystal 32 grows on the tip of the seed crystal 30. The growth of the silicon single-crystal 32 is carried out in a chamber 34, which is purged of air by argon gas.

In order to measure the lower end real diameter $D_R$ of the silicon single-crystal 32, a CCD camera 38, whose optical axis is directed to the center of the melt surface 22S, is arranged above a viewport 36 provided on the shoulder of the chamber 34. The diameter of the necked section of the silicon single-crystal 32 is small, which means the measurement thereof should be carried out with high precision. In view of this, the CCD camera 38 has a high magnification, with the width of one scanning line of this camera corresponding, for example, to 0.05 mm in the actual measurement.

The CCD camera 38 outputs a composite video signal, which is supplied to a synchronization separator circuit 40, where it is separated into a synchronization signal and a video signal $V_S$, the latter being supplied to a peak hold circuit 42. Retained in this peak hold circuit 42 is the maximum voltage $V_M$, i.e. the highest voltage of the video signal $V_S$ that has been supplied since the last resetting. This maximum voltage $V_M$ is supplied to an A/D converter 44, where it is digitized.

The video signal $V_S$ from the synchronization separator circuit 40 is also supplied to a binary-coding circuit 46, where it is compared with a reference voltage E and binary-coded, then supplied to an S/P converter 48. The horizontal synchronization signal HSYNC, obtained through separation at the synchronization separating circuit 40, is supplied to a pixel clock generator circuit 50, which operates in synchronism with this horizontal synchronization signal HSYNC to generate pixel clocks for dividing the video signal into pixels. The pixel clocks are supplied to the control terminal of the S/P converter 48. This S/P converter 48 reads, for each clock, one bit of pixel data from the binary-coding circuit 46, and supplies it to a built-in shift register (not shown), which converts the data from bit serial to bit parallel form and supplies the data to the I/O port 54 of a microcomputer 52 each time data corresponding to one word has been accumulated.

The microcomputer 52 is equipped with an I/O port 54, a CPU 56, a DMA controller 58, an image memory 60, a work memory 62, and a program memory 64, of a standard construction. The I/O port 54 receives the vertical synchronization signal VSYNC, which serves as an interruption signal, from the synchronization separator circuit 40, and is supplied with maximum voltage $V_M$ from the A/D converter 44. Further, the reference voltage E for binarization is supplied from the I/O port 54 to the binary-coding circuit 46 through a D/A converter 66.

Next, the software configuration of the microcomputer 52, shown in FIG. 2, will be described with reference to FIGS. 3 to 5.

Figure 2:
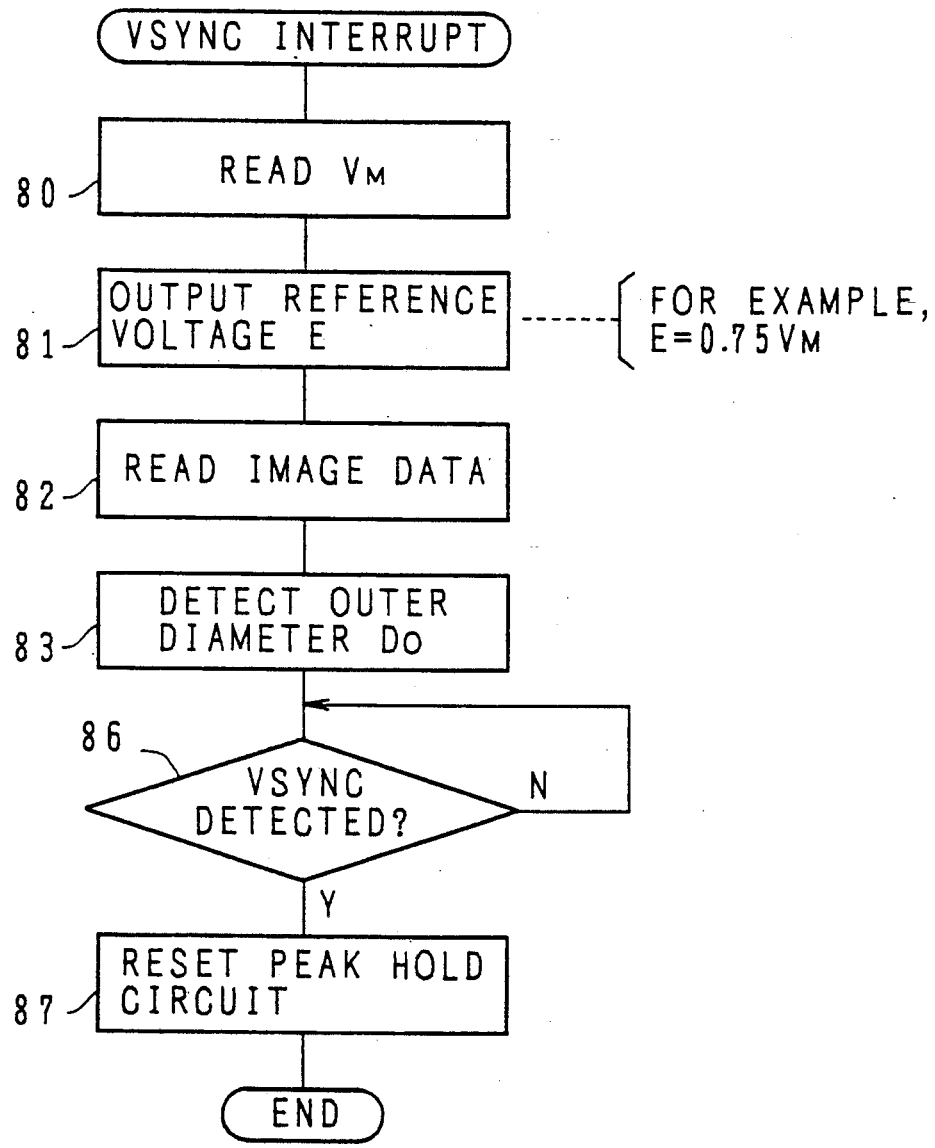
FIG. 2 a flowchart showing the software configuration of the microcomputer 5 shown in FIG. 1.

The procedures of FIG. 2 are initiated each time a vertical synchronization signal VSYNC is supplied from the synchronization separator circuit 40 to the I/O port 54 so as to cause an interrupt in the CPU 56.

In Step 80, the interrupt is masked and the maximum voltage $V_M$ is read from the A/D converter 44. This maximum voltage $V_M$ is the maximum of the respective peak values of the horizontal scanning lines in one field, which corresponds to the period starting from the reception of the vertical synchronization signal VSYNC directly preceding the one which has caused the interruption to the one which causes the next interrupt. This maximum voltage corresponds to the maximum luminance.

In Step 81, the voltage obtained by multiplying the maximum voltage $V_M$ by a certain fixed value K (e.g., K = 0.75) is supplied to the D/A converter 66 as the reference voltage E. The desirable value of K, which depends on the stop value of the CCD camera 38, decreases as the lens aperture is enlarged.

In Step 82, the video signal $V_S$ constituting the next field is compared with this reference voltage E at the binary-coding circuit 46 so as to be binary-coded, and is supplied to the S/P converter 48, where it is converted to bit parallel data and is stored in the image memory 60 by the DMA controller 58.

Figure 3:
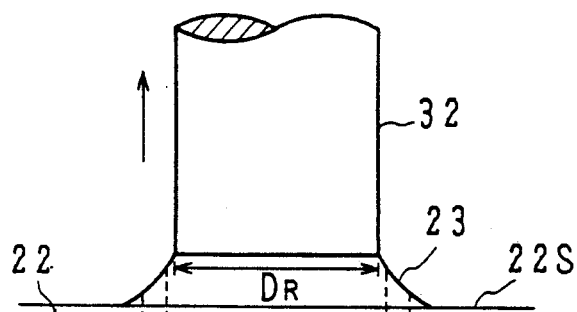
FIG. 3 is a diagram showing the region around the border between the surface 22S of the melt and the silicon single-crystal 32.
Figure 4:
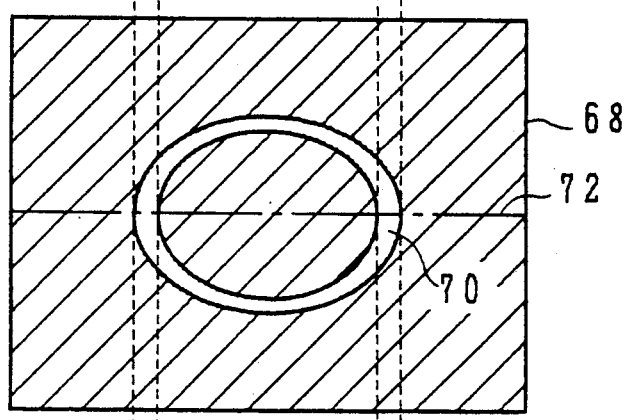
FIG. 4 is a diagram showing, in correspondence with FIG. 3, the binary image 68 stored in the image memory of FIG. 1.
Figure 5:
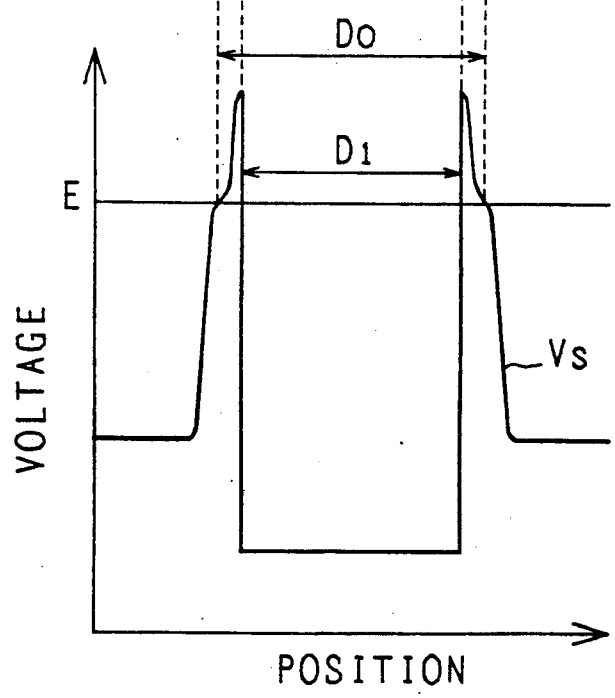
FIG. 5 is a diagram showing, in correspondence with FIG. 4, the relationship between the horizontal scanning line $V_s$ corresponding to the line 72 of FIG. 4 and the reference voltage E.

Corresponding to FIG. 3, FIG. 4 shows the binary image 68 stored in the image memory 60. The binary image 68 contains the luminous ring image 70 of the luminous ring 23 formed in the border between the silicon single-crystal 32 and the melt surface 22S. The shaded section of the drawing represents the dark section in the image.

Next, in Step 83, the binary image 68 in the image memory 60 is scanned horizontally. When the luminous ring image 70 is detected, the number of pixels N between the left and right extremes of the luminous ring image 70 is obtained with respect to one line and this number is temporarily stored in memory as $D_O$. The number N with respect to the next line is obtained likewise. If $N > D_O$, then N is regarded as $D_O$, thus superseding $D_O$. By repeating this procedure until the luminous line image 70 can no longer be detected, $D_O$ becomes equal to the outer diameter of the luminous line image 70. FIG. 5 shows the relationship between the video signal V, corresponding to the line 72 of the binary image 68, and the reference voltage E.

Next, in Step 86, the detection of a vertical synchronization signal VSYNC is awaited.

If, in Step 87, a vertical synchronization signal VSYNC is detected, the peak hold circuit 42 is reset (by discharging the electric charge that has been retained by the capacitor thereof), and the interrupt mask is cancelled. In this way, the outer diameter $D_O$ of the luminous ring image 70 is measured.

Next, the relationship between the outer diameter $D_O$ and the real diameter $D_R$ will be described.

The width of the luminous ring image 70 depends upon the tension acting on the luminous ring 23. Therefore, it is to be assumed that the width depends upon the real lower end diameter $D_R$ of the silicon single crystal 32, the angle of inclination of the lowest side surface of this silicon single-crystal, the pull rate, the temperature or the viscosity of the melt surface 22S, etc. In order to roughly grasp the relationship between the outer diameter $D_O$ and the real diameter $D_R$, the outer diameter $D_O$ of the thin necked section of a silicon single-crystal 32 was measured by the above device, and, after the completion of the growth of the silicon single-crystal 32, the real diameter $D_R$ of the silicon single-crystal 32 was measured with calipers. The relationship between these two diameters was examined and the results shown in FIGS. 6 and 7 were obtained.

Figure 6:
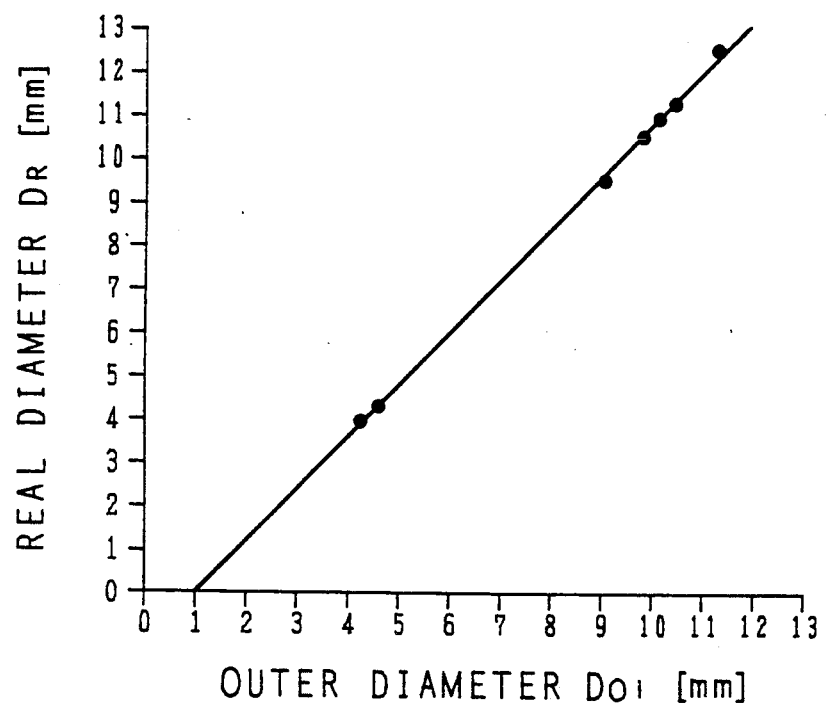
FIG. 6 is a chart showing the relationship between the real diameter $D_R$ and the outer diameter $D_O$ when the diameter of the grown crystal section is increasing.

FIG. 6 shows the relationship between the real diameter $D_R$ and the outer diameter $D_O = D_{Oi}$ in the crystal section whose diameter increases during the crystal growth process. The relationship can be expressed by the following empirical formula:

$$D_R = 1.198 D_{oi} - 1.208 \quad (1)$$

The dispersion $S^2$ and the correlation coefficient R were as follows:

$$S^2 = 1.126 \times 10^{-2}$$

$$R = 0.9996.$$

Figure 7:
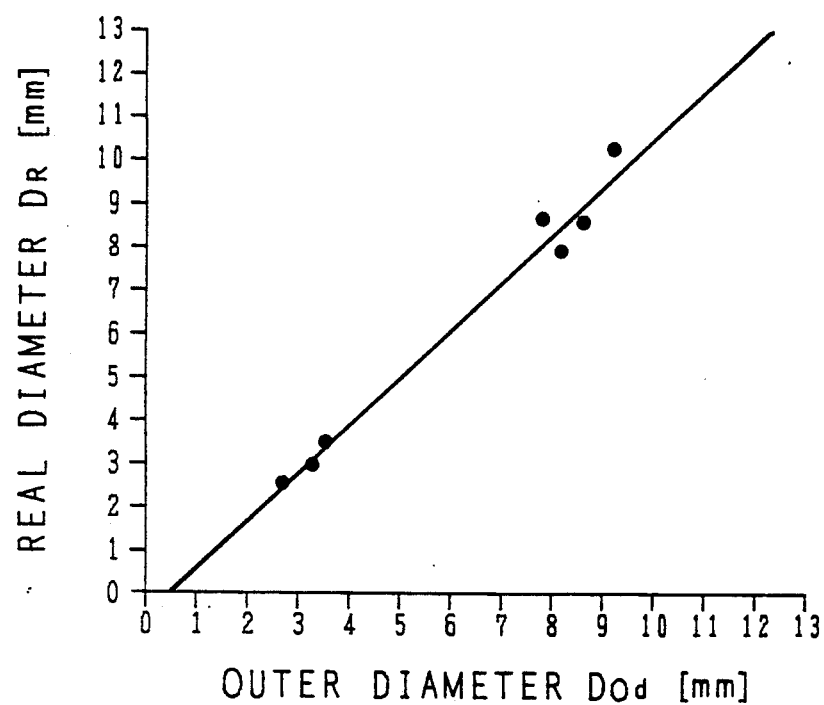
FIG. 7 is a chart showing the relationship between the real diameter $D_R$ and the outer diameter $D_O$ when the diameter of the grown crystal section is decreasing.

FIG. 7 shows the relationship between the real diameter $D_R$ and the outer diameter $D_O = D_{Od}$ in the crystal section whose diameter decreases during the crystal growth process. The relationship can be expressed by the following empirical formula:

$$D_R = 1.107 D_{Od} - 0.5485 \quad (2)$$

The dispersion $S^2$ and the correlation coefficient R were as follows:

$$S^2 = 0.2389$$

$$R = 0.9904.$$

By eliminating the real diameter $D_R$ from the above formulae (1) and (2), the following formula can be obtained:

$$\Delta D_{id} = D_{Oi} - D_{Od} = 0.5506 - 0.076 D_{Od} \quad (3)$$

If the real diameter $D_R$ decreases, the decrement of the outer diameter $D_O$ is larger than the decrement of this $D_R$ by the difference $\Delta D_{id}$ between $D_{Oi}$ and $D_{Od}$. If, conversely, the real diameter $D_R$ increases, the increment of the outer diameter $D_O$ is larger than the increment of $D_R$ by $\Delta D_{id}$. From the above formulae (1) and (2), the increment of $D_{Od}$ with respect to the increment of the real diameter $D_R$ is larger than the increment of $D_{Oi}$ with respect to the increment of the real diameter $D_R$. Accordingly, if, instead of the inner diameter $D_I$, the outer diameter $D_O$ is used for growth control in the necked crystal section, the outer diameter $D_O$ becomes smaller and the adjustment of the outer diameter for causing the outer diameter $D_O$ to approach the desired value becomes larger than in the reverse case. The smaller the real diameter $D_R$, the larger is this $\Delta D_{id}$. The real diameter $D_R$ in the necked crystal section can be as small as 2 to 5 mm. In this section, $\Delta D_{id} = 0.4$ to 0.2. This amount is significant with respect to this invention since, as stated above, the absolute value of the deviation in the diameter control in the necked section has to be not more than approx. 0.5 mm.

Next to be described will be an embodiment wherein the growth control in the necked crystal section is performed by using the measurement of the outer diameter $D_O$.

Figure 8:
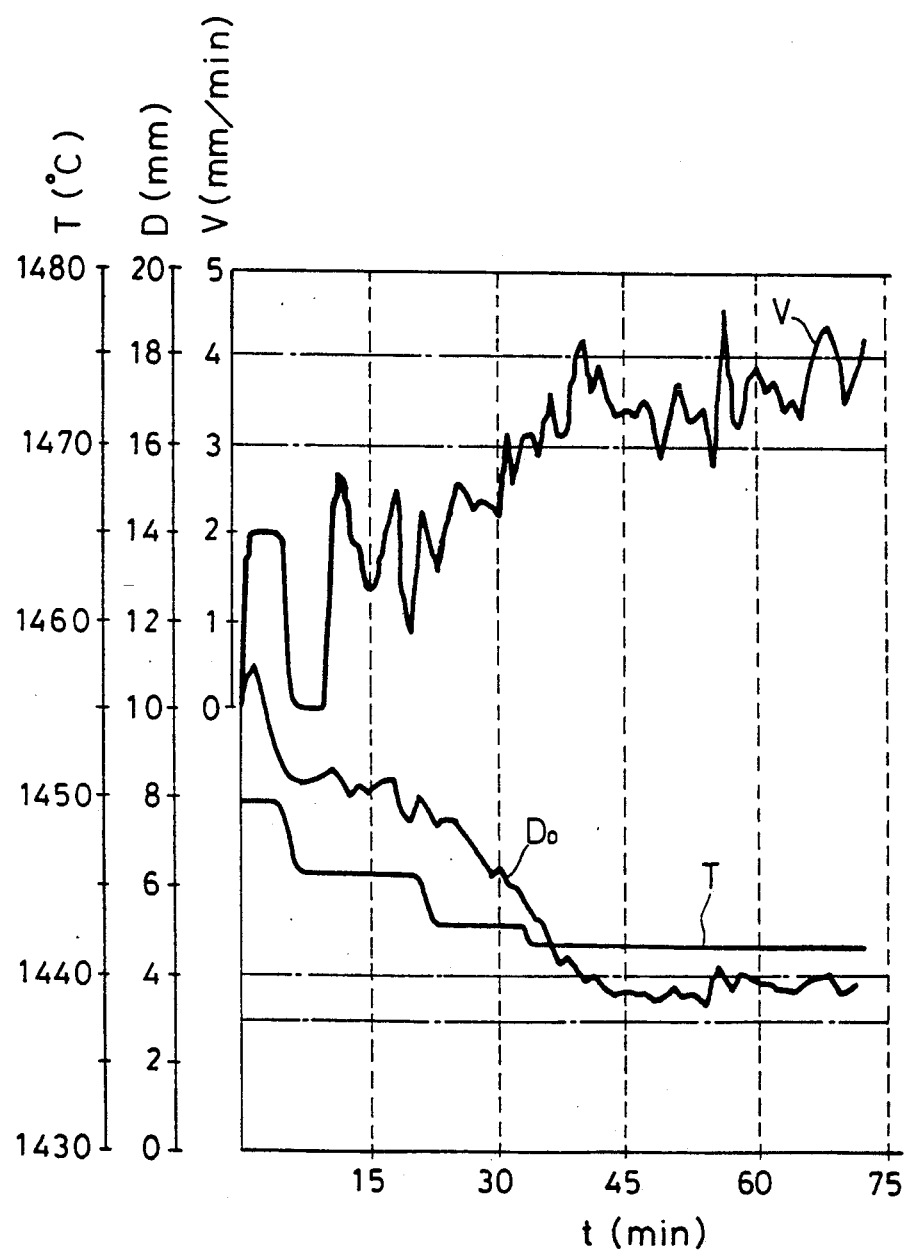
FIG. 8 is a chart showing the outer diameter $D_O$, the melt surface temperature T, and the crystal pull rate V with respect to the time elapsing from the start of the crystal growth when actually performing the automatic control on the growth of the necked region of a crystal.

FIG. 8 shows the changes in the outer diameter $D_O$, the melt surface temperature T, and the crystal pull rate V with respect to the time t measured from the start of the pull in the case where the crystal growth in the necked section is controlled by a fully automated process. In the range of 40 min. $\leq t \leq 70$ min., the desired value of the outer diameter $D_O$ is 3.5 mm, and the rotational speed of the crystal pull motor is controlled by PID action in such a manner that the outer diameter $D_O$ attains this desired value. As can be seen from this graph, the outer diameter $D_O$ rarely becomes lower than the desired value. In the conventional method, the real diameter $D_R$ undergoes changes above and below the desired value due to the symmetrical nature of the PID action.

In the crystal growth in the necked section, making the diameter of the silicon single-crystal 32 excessively small results in a disconnection between the lower end of the crystal and the melt surface 32, making it impossible to continue the crystal growth process. In this invention, in contrast, such an interruption can be avoided for the reason stated above, thus enhancing the success rate in the automatic control of the crystal growth in the necked section.

SECOND EMBODIMENT

As stated above, the outer diameter $D_O$ depends upon the real lower end diameter $D_R$ of the silicon single-crystal 32, the angle of inclination of the lower end side surface of the crystal, the pull rate, etc. In view of this, the second embodiment utilizes this relationship. In this embodiment, a pseudo outer diameter analogous to the outer diameter $D_O$ is calculated from the inner diameter $D_I$, and this pseudo outer diameter $D_{OL}$ is used for the crystal diameter control.

Figure 9:
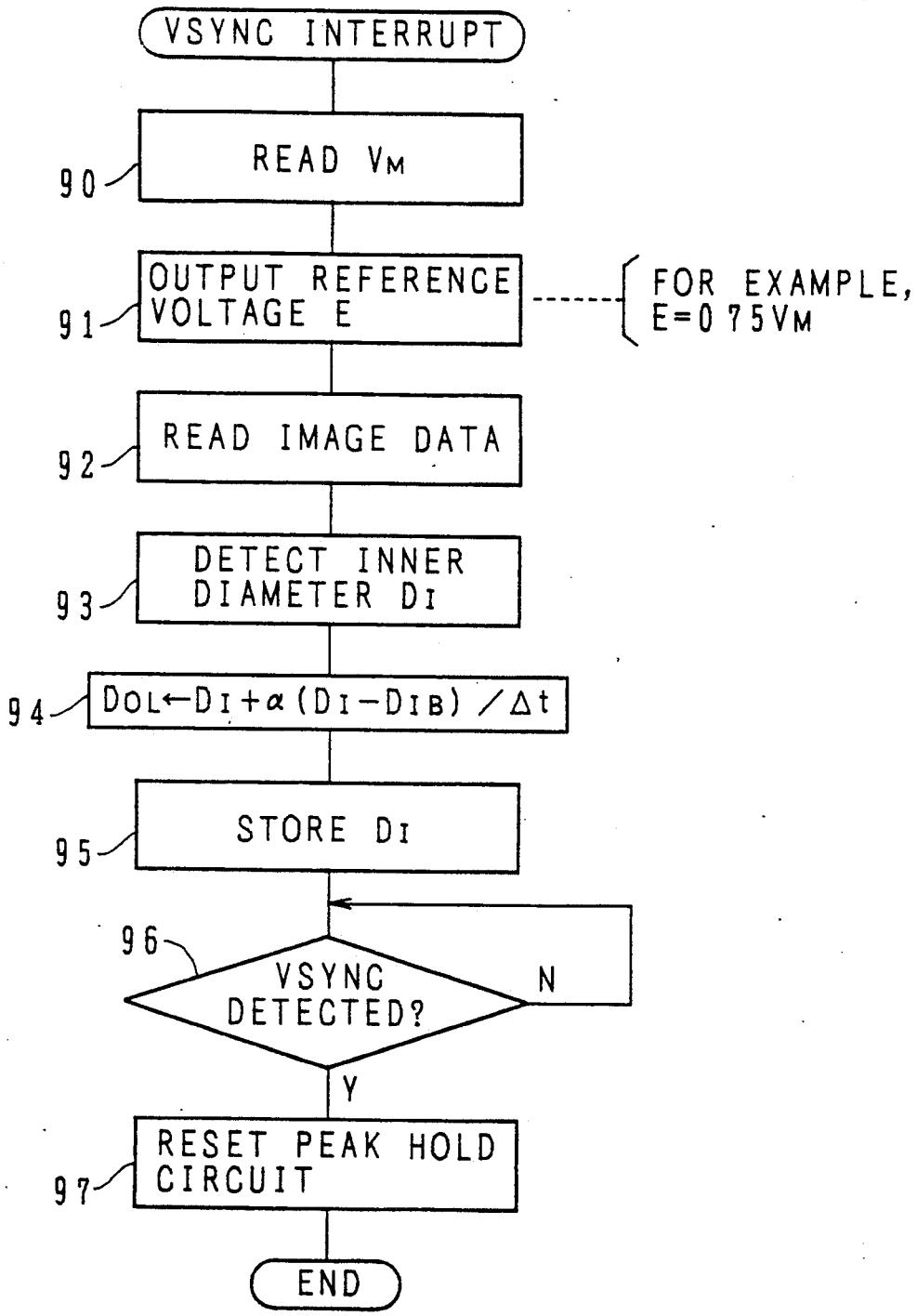
FIG. 9 is a flowchart showing the software configuration of the microcomputer in a second embodiment of this invention.

The hardware configuration is the same as that shown in FIG. 1. FIG. 9 shows the software configuration of the microcomputer 52 of FIG. 1. Steps 90 through 92 are the same as Steps 80 through 82 in FIG. 2.

In Step 93, the inner diameter $D_I$ of the luminous ring image shown in FIG. 4 is detected in the same manner as in Step 83.

In Step 94, the pseudo outer diameter $D_{OL}$ is obtained from the following formula:

$$D_{OL} = D_I + \alpha(D_I - D_{IB})/\Delta t \qquad (4)$$

where $D_{IB}$ is the value of the inner diameter $D_I$ at the time $\Delta t$ prior to the time when the inner diameter $D_I$ is measured. This value is stored in the memory 62. When, for example, $D_I - D_{IB} < 0$, $\alpha$ is a positive constant, and, when $D_I - D_{IB} > 0$, it is 0.

In Step 95, this inner diameter $D_I$ is temporarily stored in the work memory 62 as $D_{IB}$.

Afterwards, the same procedures as Steps 86 and 87 of FIG. 2 are carried out in Steps 96 and 97.

Through these procedures, results similar to those in the first example can be obtained. Further, it is possible to modify $\alpha$ in the above formula (1) while conducting learning so that the diameter control may be effected more satisfactorily.

Apart from the above embodiments, this invention includes various variations.

For example, the reference voltage E may be updated each time several tens of fields have been scanned. Further, the detection of the peak voltage $V_M$ and the binarization may be alternately performed for each horizontal scanning line. The reference voltage E may be set at a value lower than the peak voltage $V_M$ by a certain fixed value. Further, instead of $\Delta t$ in the above formula (4), the increment of the pull distance may be used.

What is claimed is:

1. A diameter measuring method for automatic crystal diameter control, comprising the steps of:
    photographing a growing section of a single crystal and supplying a video voltage signal by means of a camera;
    obtaining a reference voltage (E) for binary-coding said video voltage signal based on a serial of said video voltage signal;
    obtaining a binary image by binary-coding said video voltage signal in comparison with said reference voltage; and
    detecting an outer diameter ($D_o$), for the crystal diameter control, of a luminous ring image from said binary image.

2. A diameter measuring method for automatic crystal diameter control, comprising the steps of:
    photographing a growing section of a single crystal and supplying a video voltage signal by means of a camera;
    detecting a maximum voltage ($V_m$) of said video voltage signal with respect to one or more scanning lines;
    obtaining a reference voltage (E) based on said maximum voltage;
    obtaining a binary image by binary-coding said video voltage signal in comparison with said reference voltage; and
    detecting the outer diameter ($D_o$), for control of crystal diameter, of a luminous ring image from said binary image.

3. A method according to claim 2, wherein said maximum voltage ($V_m$) is detected from said video voltage signal of one field.

4. A method according to claim 2, wherein said reference voltage (E) is said maximum voltage ($V_m$) multiplied by a constant less than 1.0.

5. A method according to claim 2 wherein the crystal diameter is between about 2 to about 5 millimeters.

6. A diameter measuring device for automatic crystal diameter control, comprising:
    a camera for photographing a growing section of a single crystal and supplying a video voltage signal;
    a means for detecting a maximum voltage ($V_m$) of said video voltage signal with respect to one or more scanning lines;
    a means for obtaining a reference voltage (E) based on said maximum voltage;
    a means for obtaining a binary image by binary-coding said video voltage signal in comparison with said reference voltage; and
    a means for detecting the outer diameter ($D_o$), for control of crystal diameter, of a luminous ring image from said binary image.

7. A device according to claim 6, wherein said maximum voltage (V) is the multiplication of said maximum voltage (V) and a constant less than 1.0.

8. A device according to claim 7, wherein said reference voltage (E) is said maximum voltage ($V_m$) multiplied by a constant less than 1.0.

9. A method according to claim 7 wherein the crystal diameter is between about 2 and about 5 millimeters.

10. A diameter measuring method for automatic crystal diameter control, comprising the steps of:

photographing a growing section of a single crystal and supplying a video voltage signal by means of a camera;

detecting a maximum voltage ($V_m$) of said video voltage signal with respect to one or more scanning line;

obtaining a reference voltage (E) based on said maximum signal voltage;

obtaining a binary image by binary-coding said video voltage signal in comparison with said reference voltage;

detecting the inner diameter ($D_I$) of a luminous ring image from said binary image;

storing said inner diameter ($D_I$) in a memory; and calculating a pseudo diameter ($D_{OL}$) for control of crystal diameter according to the formula $D_{OL} = D_1 + \alpha (D_{1B} - D_1)/\Delta t$ where $D_1$ is the voltage of said stored inner diameter $D_I$ at the time $\Delta t$ prior to the time when said inner diameter $D_i$ detected and where $\alpha$ is positive constant when $D_1 - D_{1B} > 0$.

11. A method according to claim 10, wherein said maximum voltage ($V_m$) is detected from said video voltage signal of one field.

12. A method according to claim 10, wherein said reference voltage (E) is said maximum voltage ($V_m$) multiplied by a constant less than 1.0.

13. A method according to claim 10 wherein the crystal diameter is between about 2 and about 5 millimeters.

* * * * *

UNITED STATES PATENT AND TRADEMARK OFFICE
CERTIFICATE OF CORRECTION

PATENT NO. : 5,138,179

DATED : Aug. 11, 1992

INVENTOR(S) : BABA et al.

It is certified that error appears in the above-identified patent and that said Letters Patent is hereby corrected as shown below:

Column 8:
Claim 8, line 1, delete "7" and insert therefore --6--; and

Column 8:
Claim 9, line 1, delete "7" and insert therefore --6--.

Signed and Sealed this

Twenty-ninth Day of March, 1994

Attest:

BRUCE LEHMAN

Attesting Officer

Commissioner of Patents and Trademarks